METHOD OF MAKING P-N JUNCTION SEMICONDUCTOR UNITS

Filed Aug. 22, 1952

Inventors:
Albert C. English,
John B Seabrook,
by Paul A. Frank
Their Attorney.

United States Patent Office 2,765,245

Patented Oct. 2, 1956

2,765,245

METHOD OF MAKING P-N JUNCTION SEMICONDUCTOR UNITS

Albert C. English and John B. Seabrook, Lynn, Mass., assignors to General Electric Company, a corporation of New York Application August 22, 1952, Serial No. 305,838

10 Claims. (Cl. 148—1.5)

Figure 1:
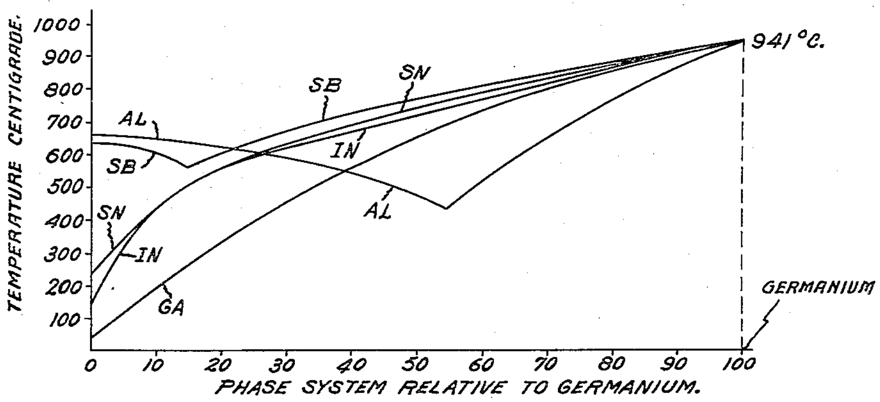

The invention relates to methods for making semiconductor bodies called "P–N junction units" having a region of positive conductivity adjoining a region of negative conductivity and forming between these regions an electrical space charge barrier known as a "P–N junction."

Semiconductors, such as germanium and silicon, are materials whose electric conductivity lies between the poor conductivity of "insulators" and the excellent conductivity of certain metallic "conductors." Conduction in semiconductors is primarily electronic; the conduction carriers being either electrons or electron vacancies (positive "holes") produced by the movement of electrons. The conductivity of semiconductors is greatly affected by changes in temperature and by impurities found in the semiconductor.

More specifically, semiconductors have become conventionally classified as either positive (P-type), negative (N-type), or intrinsic (neither positive nor negative), depending primarily upon the type and sign of their predominant conduction carriers. With P-type semiconductors, the direction of rectification as well as the polarity of a thermoelectric or Hall effect voltage are all opposite to that produced with N-type semiconductor. It has been found that the determinant of whether a particular semiconductor exhibits N-type or P-type characteristics lies primarily in the type of impurity elements present in the semiconductor. Some impurity elements, termed "donors," usually having a higher valence than the semiconductor, function to furnish additional free electrons to the semiconductor so as to produce an electronic excess N-type semiconductor; while other impurity elements, termed "acceptors," usually having a lower valence than the semiconductor, function to absorb the electrons to create P-type semiconductor with an excess of "positive holes." Antimony, phosphorus, and arsenic, falling in group V of the periodic table, are examples of "donor" impurities producing N-type germanium or silicon semiconductor; while aluminum, gallium, and indium, falling in group III of the periodic table, as well as zinc, are examples of "acceptor" impurities producing P-type germanium or silicon semiconductor. Donor and acceptor impurity elements are hereinafter referred to as electrically "significant" impurities while other elements electrically neutral to semiconductors are referred to as "neutral" impurities. Tin and gold are examples of neutral impurities which combine readily with germanium and silicon. Only minute amounts of the electrically significant impurity elements are normally necessary to produce marked electrical characteristics of one type or the other. Concentrations of some electrically significant impurities of less than one part per million may be sufficient.

It has been known for some time that if a substantially pure semiconductor ingot is prepared by solidification from a melt, the ingot may contain adjoining regions of P-type and N-type semiconductor with an intermediate rectifying barrier layer called a "P–N junction." When a piece of semiconductor bisected by this P–N junction is cut out of the ingot, the resulting P–N junction unit is found to possess marked rectifying photoresponsive and thermoresponsive properties. Electric currents may be passed easily in only one direction through the junction and may be generated or modified by light or heat concentrated upon the junction.

More recently it has been found that multiple P–N junction units having a region of one conductivity type between two regions of opposite conductivity type can be used in a three-terminal device known as a "transistor" to produce voltage, current, and power amplification. Such multiple junction units have become known as "N–P–N" or "P–N–P" units in accord with the distribution of their conductivity type regions.

In most methods heretofore employed to provide P–N junction units, an entire ingot containing one or two P–N junctions is produced and a number of small P–N junction units is extracted from the portion of this ingot bordering the P–N junction. Relatively few methods have been provided for directly and individually making P–N junction units from small, pre-formed, or pre-cut semiconductor bodies. Accordingly, an important object of the invention is to provide improved and simplified methods for individually making small P–N junction units containing one or more P–N junctions.

In the copending application of William C. Dunlap, Serial No. 187,490, filed September 29, 1950, now abandoned, there is disclosed a method for individually making single or multiple junction units suitable for use in asymmetrically conductive devices, thermoresponsive devices, photoresponsive devices, and transistors. The method of this Dunlap application is to deposit upon the surface of a semiconductor body having a predominance of conduction carriers of one polarity an electrically significant impurity element capable of inducing in the semiconductor conduction carriers of opposite polarity; and then to heat the unit until an impregnation and diffusion of the impurity element to a limited depth within the semiconductor body is accomplished. The region of the semiconductor impregnated with the significant impurity element by this heating step becomes converted thereby to a conductivity type opposite to that of the remainder unimpregnated region, and a P–N junction is thus formed between the two resulting opposite conductivity regions.

While this impurity diffusion method has proved highly successful in producing excellent quality P–N junction units, certain problems are encountered in its actual practice. The heating step must be accurately controlled since heating for too long a time or at too high a temperature causes an impurity impregnation of the entire semiconductor body. In addition, the exact depth and impurity concentration characteristics at the junction are somewhat difficult to determine and control since the location and composition of the junction varies as the impurity impregnation and diffusion proceeds. Moreover, the entire semiconductor body must be elevated in temperature to a temperature (usually above 500° C.) at which impurity impregnation and diffusion occurs. It has been found in some cases, especially where the semiconductor body is raised to temperatures close to the melting point of the semiconductor involved, that temperature strains are introduced in the semiconductor body and tend to impair the useful rectifying and other electrical properties of the resulting P–N junction unit.

Accordingly, one specific object of our present invention is to provide a method for producing in a semiconductor body P–N junctions whose location and impurity concentration gradient across the junction can be easily and accurately controlled. Another specific object is to provide a method of directly producing individual P–N junction units, which method does not require that the semiconductor body be subjected to a predetermined heating step. A further object is to provide a method of making P–N junction units having excellent rectifying characteristics.

In accord with the invention, an alloy melt is prepared comprising a semiconductor and either a donor or an acceptor impurity element capable of inducing, in the semiconductor, conduction carriers (either negative electrons or positive "holes") of one predetermined polarity. The selected significant impurity element is included in amounts sufficient to produce an alloy composition that completely melts at a temperature considerably below the melting point of the semiconductor involved. Where, for some chemical reason, the selected significant impurity does not readily produce a melt with the semiconductor at such low temperatures, an electrically neutral impurity element, such as tin or gold, which does produce a low temperature alloy melt with the semiconductor may be employed to carry the significant impurity into the alloy melt. A small amount of this alloy melt is then deposited, preferably in the form of a small droplet, upon the surface of a solid semiconductor body having a predominance of conduction carriers therein whose polarity is opposite to that induced by the impurity element in the melt. In other words, if an acceptor impurity element is included in the melt, the semiconductor body upon whose surface the melt is deposited is N-type; while if a donor impurity element is included in the melt, the semiconductor body upon whose surface the melt is deposited is P-type. The surface of the semiconductor body is preferably polished and etched before the melt is deposited thereon, and the semiconductor body is preferably monocrystalline with a minimum of lattice distortions. As the deposited alloy melt cools and solidifies, semiconductor crystals having a conductivity type opposite to that of the semiconductor body upon which the melt is deposited form and grow out of the melt upon the surface of the semiconductor body to produce an integrally formed P–N junction located where the surface of the conductor body had been. A P–N junction unit is thus directly and simply provided. The alloy melt may likewise be deposited on two distinct surface areas of the semiconductor body such as upon opposite major surfaces of the body in order to produce "N–P–N" or "P–N–P" junction units, as desired.

In accord with a further feature of the invention, P–N junction units having improved rectification characteristics may be provided by preparing two melts, one comprising the semiconductor and a donor impurity, and the other comprising a semiconductor and an acceptor impurity; both melts having melting points considerably below the melting point of the semiconductor involved. One alloy melt is then deposited upon one surface area of a semiconductor body having either P-type or N-type conductivity characteristics, while the other melt is deposited upon a different surface area of the semiconductor body. Upon cooling and solidification, one deposited melt becomes a P-type semiconductor region of the resulting unit, and the other deposited melt becomes an N-type semiconductor region of the resulting unit. If the original semiconductor body upon which the melts are deposited is P-type, the P–N junction is formed between such P-type body and the solidified N-type alloy melt; while if the original semiconductor body is N-type, the P–N junction is formed between such N-type body and the solidified P-type alloy melt. The remaining junction, in each case, constitutes an excellent conduction-carrier-furnishing electrode connection with no rectifying tendencies.

Figure 2:
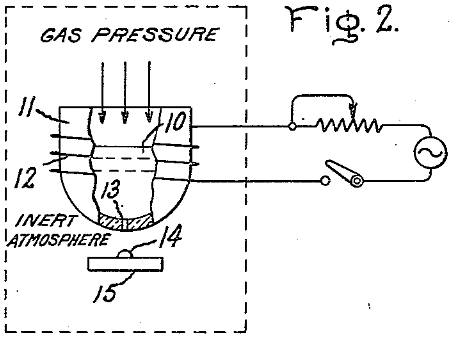
Figure 3:
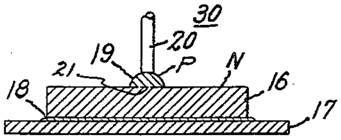
Figure 4:
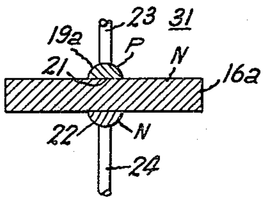
Figure 5:
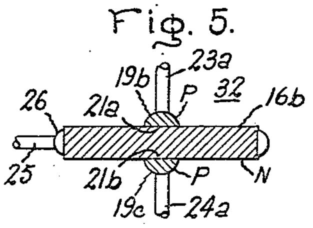

Those skilled in the art may better understand the invention by referring to the following detailed description together with the accompanying drawings in which Fig. 1 is a group of curves showing the liquid-to-solid phase system of various donor, acceptor and electrically neutral impurities relative to the semiconductor germanium, Fig. 2 is a view, partly in section, of apparatus which may conveniently be employed in practicing the invention, Fig. 3 and Fig. 4 are cross-sectional views of rectifiers embodying different types of P–N junction units made in accord with the invention, and Fig. 5 is a similar view of a transistor embodying a P–N–P junction unit made in accord with the invention.

In the detailed practice of our new method, a melt is prepared comprising a semiconductor, such as germanium, and a donor or an acceptor impurity element for the semiconductor. The semiconductor is preferably highly purified. N or P-type germanium, for example, having a purity corresponding to a resistivity above two ohm centimeters is suitable.

The selected donor or acceptor impurity is preferably the only remaining constituent of the melt, although in the case of certain significant impurities, for example, the volatile donor impurity arsenic, it may be desirable to employ a neutral carrier such as tin to introduce the impurity element into the melt. The amount of significant impurity included in the neutral carrier is not critical since even small percentages of such significant impurity will have the desired electrical effect upon the resulting alloy melt.

The ratio of significant and neutral impurities relative to the semiconductor included in the melt should be such as to enable the resulting alloy composition to become completely melted at temperatures below 85% of the absolute temperature melting point of the semiconductor included in the melt and preferably below about 76% thereof. For example, the absolute temperature melting point of pure germanium is about 1214° Kelvin (941° C.) and the ratio of significant and neutral impurity elements relative to germanium should be such as to produce a melting point of the resulting alloy composition less, in round figures, than about 750° C. (1203° K.), and preferably less than about 650° C. (923° K.). The absolute temperature melting point of pure silicon is about 1700° Kelvin (1430° C.), and the ratio of significant and neutral impurity elements relative to germanium should be such as to produce a melting point of the resulting alloy composition less, in round figures, than 1170° C., and preferably less than 1020° C.

Referring to Fig. 1, there are shown typical liquid-to-solid phase diagrams of various donor, acceptor and neutral impurities relative to germanium. As can be seen from these diagrams, all of the depicted impurity element-germanium combinations have ranges of alloy compositions whose melting points lie below 750° C. The following table gives the percentage by weight of various donor, acceptor, and neutral impurity elements to be individually combined with germanium to provide alloy compositions whose melting points lie below 750° C., and to provide alloy compositions whose melting points lie below 650° C.

| | Impurity | Melting Points | |
|---|---|---|---|
| | | Less Than 750° C. | Less Than 650° C. |
| Percent by weight of impurity content in a melt consisting of germanium and the designated impurity. | *Donors* | | |
| | (a) Antimony | above 50% | above 75%. |
| | (b) Tin with small percent arsenic. | above 50% | above 65%. |
| | *Acceptors* | | |
| | (a) Indium | above 40% | above 60%. |
| | (b) Gallium | above 35% | above 50%. |
| | (c) Aluminum | above 20% | above 30%. |
| | (d) Zinc | above 45% | above 75%. |
| | *Neutral* | | |
| | (a) Tin | above 50% | above 65%. |
| | (b) Gold | 45–92% | 60–90%. |

As can be seen from this table, the designated acceptor.

donor, and neutral impurity elements must be added to a germanium melt in amounts varying from about 20% to above 50% of the total melt in order to produce resulting alloy compositions having melting points less than 750° C.; and must be added in amounts varying from above 30% to above 75% of the total melt in order to produce resulting alloy compositions having melting points less than 650° C.

If silicon rather than germanium is employed as the semiconductor, the alloy compositions resulting from the addition of the above-mentioned acceptor and donor impurities in amounts varying from above 20% to above 50% of the total composition have melting points less than 1170° C. Similarly, the addition of these impurities to a silicon melt in amounts varying from above 30% to above 75% of the total melt produces resulting alloy compositions having melting points less than 1020° C. It is desirable, however, that at least 5% semiconductor be included in the alloy melt. In general, the inclusion in a semiconductor melt of any of the designated significant and neutral impurities in amounts above 50% and less than 95% by weight of the total melt will produce alloy compositions that are usable in connection with the invention; and the inclusion of these impurities in amounts between 65% and 90% by weight of the total melt is ordinarily preferred.

The alloy melt comprising the semiconductor and the selected significant impurity element in the weight ratios discussed above is maintained immediately prior to its deposit upon the solid semiconductor body at a temperature above its melting point but below 85% of the absolute temperature melting point of the semiconductor involved. Preferably, the ratio of semiconductor to the selected significant impurity element or to the combination of selected significant impurity element and neutral impurity element is such that the resulting N-type or P-type alloy melt can be and is maintained in a totally liquified state at temperatures below 76% of the absolute melting temperature of the semiconductor involved.

This alloy melt is then deposited while in a liquid state upon the surface of a solid body of the same semiconductor as that included in the melt. One convenient technique and apparatus for depositing the molten alloy upon the solid semiconductor body is illustrated in Fig. 2. A melt 10, prepared as described above and comprising the semiconductor and a selected donor or acceptor impurity element, is maintained in a molten state within quartz crucible 11, by heat from heating element 12. Crucible 11 is supported within a vacuum or inert atmosphere in a furnace (not shown) and has a small hole 13 at the bottom. The diameter of hole 13 is too small, for example less than 0.015 inch, for gravity alone to force melt 10 therethrough. However, by applying an additional gas pressure upon the surface of melt 10, a liquid droplet 14 may be forced out of hole 11 to fall upon a semiconductor wafer 15 below. The gas employed is one such as argon, that is chemically inactive with respect to the semiconductor involved. Many other techniques for depositing melt 10 while in a liquid state upon the surface of semiconductor wafer 15 can alternatively be employed.

Semiconductor wafer 15 has conductivity characteristics opposite to that of the melt 10 and of droplet 14, and is preferably monocrystalline. Semiconductor wafers 15 having either positive or negative conductivity characteristics, as desired, may be provided by any of the techniques well known to those skilled in the art. For example, a monocrystalline P-type semiconductor ingot may be grown by seed crystal withdrawal from a melt consisting of a highly purified semiconductor and a trace of an acceptor impurity, usually much less than 0.5%. An N-type monocrystalline semiconductor ingot may likewise be grown by seed crystal withdrawal from a melt consisting of a highly purified semiconductor and a similar amount of a donor impurity. A P-type or N-type wafer 15 of desired shape and size may then be cut out of the appropriate ingot. For most purposes, wafer 15 may conveniently have length and width dimensions about 0.50 inch and a thickness dimension about 0.020 inch.

The surface of semiconductor wafer 15 is preferably polished smooth and then chemically etched before alloy melt 10 is deposited thereon. A chemical etch consisting of 1 part concentrated hydrofluoric acid to 4 parts concentrated nitric acid is quite suitable.

So long as semiconductor wafer is within a few centimeters from crucible 11, wafer 15 need not ordinarily be raised to or maintained at any specific temperature by external heating means other than heating element 13 before melt 10 is deposited thereon. The heat radiating from heating element 12 is usually sufficient to cause droplet 14 to wet solid wafer 15, and thus to fuse to wafer 15 as the droplet cools and crystallizes. The temperature of wafer 15 upon deposit of droplet 14 may be, for example, about 300° C., although its temperature is not critical. Sufficient heat must be generated either by the deposited melt or by the heat radiating from element 12 merely to insure that the melt actually "wets" the surface of wafer 15.

As the alloy melt 10 deposited as droplet 14 on the surface of semiconductor wafer 15 begins to cool, the semiconductor crystallizing out of the cooling melt grows on the surface of wafer 15. If water 15 is monocrystalline and its surface is etched clean, the semiconductor crystallizing out of the melt is deposited as a layer of small similarly oriented crystals in which the edges and planes follow almost flawlessly the underlying orientation of the surface of the semiconductor body. A uniform P–N junction is thus formed on the surface of wafer 15, and the solidified deposited droplet 14 becomes a fused and integral part of the entire unit.

Referring to Figs. 3 and 4, there are shown two rectifiers 30 and 31 employing P–N junction units made in accord with the invention. In rectifier 30 of Fig. 3, a monocrystalline N-type germanium wafer 16 having length and width dimensions approximately 0.50 inch and a thickness dimension approximately 0.020 inch is connected to an electrode block 17 such as fernico by such means as an antimony or tin solder 18. Wafer 16, may, for example, be produced by growing a monocrystalline ingot from a melt consisting of germanium containing 0.05% antimony, and then cutting wafer 16 out of the ingot thus grown. The upper exposed surface of germanium wafer 16 is polished and etched as described above. A P-type liquid droplet 19 derived, for example, from a melt consisting of 10% germanium and 90% indium is deposited on the polished and etched surface of germanium N-type wafer 16. The germanium-indium melt from which droplet 19 is derived is maintained at a temperature slightly below 550° C. Wire 20 or other electrical conductor may be connected in any suitable manner to indium-germanium droplet 19. Wire 20, is for example, embedded within droplet 19 while the droplet is still in a liquid state and becomes fused thereto as the droplet solidifies upon the surface of wafer 16. A P–N junction 21 is formed, as described above, at the former surface of wafer 16 between the P-type and N-type regions of the resulting unit. The entire device may be used to rectify alternating currents supplied between electrodes 17 and 20.

In rectifier 31 of Fig. 4, an N-type or P-type monocrystalline germanium wafer 16*a* has both opposing major surfaces polished and etched. A liquid P-type droplet 19*a* which may have the same P-type germanium-indium composition as droplet 19 of rectifier 30 is deposited on one surface of wafer 16*a* and allowed to solidify. Wafer 16*a* together with the fused and solidified P-type droplet 19*a* is then overturned and a droplet 22 of N-type germanium alloy is deposited upon the other surface of wafer 16*a* perferably directly opposite droplet 19*a*. N-type droplet 22 may be derived, for example, from a melt consisting of 10% germanium, 89% tin and 1% arsenic or from a melt consisting of 10% germanium and 90% antimony. The germanium-arsenic tin melt or the germanium-antimony melt from which N-type droplet 22 is derived is maintained at a temperature slightly below 650° C. Wires 23 and 24 are respectively connected to droplets 19*a* and 22. If N-type germanium is used for wafer 16*a*, the P–N junction is formed between the solidified P-type droplet 19*a* and the surface of wafer 16*a*. In this case the N-type droplet 22 constitutes a good electron-furnishing electrode connection to wafer 16*a*. If P-type germanium is employed for wafer 16*a*, the P–N junction is formed between the solidified N-type droplet 22 and this P-type wafer 16*a*, and the solidified P-type droplet 19*a* constitutes a good "positive-hole" furnishing electrode connection to the P-type wafer 16*a*. Rectifiers constructed in accord with Figs. 3 and 4 have a forward to back resistance ratio above 10,000 to 1 and are capable of withstanding peak inverse voltages more than 300 volts. It will be appreciated that in rectifier 30 of Fig. 3, a P-type germanium wafer may be substituted for the illustrated N-type germanium wafer 16 and an N-type droplet such as droplet 22 substituted for the P-type droplet 19. A P-type wafer may, for example, be produced by extraction from a monocrystalline ingot grown from a melt consisting of germanium containing 0.25% indium.

Referring now to Fig. 5, there is shown a transistor 32 incorporating a P–N–P junction unit made in accord with the invention. In transistor 32 a germanium wafer 16*b*, designated as N–type, has two P–type germanium droplets 19*b* and 19*c* similar to droplet 19 of Fig. 3 deposited upon opposite major surfaces of N-type wafer 16*b*. Wires 23*a* and 24*a* are respectively connected to droplets 19*b* and 19*c*, either before or after the droplets solidify. Wire 25 is connected by any suitable electrically conductive means, such as by a neutral (tin) or donor (antimony) solder connection 26, to the N-type portion of wafer 16*b*. Connection 26 may extend around the periphery of wafer 16*b* or may be an N-type germanium droplet similar to droplet 22 of rectifier 31. Upon solidification of droplets 19*b* and 19*c* two P–N junctions 21*a* and 21*b* are formed between each P-type droplet 19*b* and 19*c* and the intermediate N-type wafer 16*b*. In the transistor 32 thus formed, one P–N junction, such as junction 21*a*, constitutes the "emitter" junction while the other P–N junction, such as junction 21*b*, constitutes the "collector" junction. Wire 23*a* contacting P-type droplet 19*b* then constitutes the "emitter" electrode, wire 24*a* contacting P-type droplet 19*c* constitutes the "collector" electrode, and wire 25 connected to the N-type semiconductor body 16*b* constitutes the "base" or "return" electrode.

In the well known operation of a transistor such as transistor 32 shown in Fig. 5, a small change in current between emitter electrode 23*a* and base electrode 25 with emitter electrode 23*a* biased in the "forward" or easy-flow direction relative to base electrode 25, produces a greater change in the current between collector electrode 24*a* and return electrode 25 with the collector electrode 24*a* biased in the "reverse" or difficult-flow direction relative to base electrode 25. It will, of course, be appreciated that if a P-type germanium wafer is substituted for the N-type wafer 16*b*, N-type droplets such as droplet 22 of rectifier 31 must be substituted for droplets 19*b* and 19*c* and a neutral or acceptor impurity solder substituted for a donor impurity solder in connection 26.

It will thus be seen that we have provided a simple but highly versatile method of individually producing single or multiple P–N junction units suitable for many purposes. The semiconductor body upon which the semiconductor alloy melt is deposited need not be subjected to any predetermined heating cycle. Since the semiconductor alloy melt is deposited at a temperature considerably below the absolute temperature melting point of the semi-conductor involved, substantially no temperature strain of the resulting unit occurs. In addition, the concentration of impurities bordering the P–N junction can be easily controlled and determined by the percentage of donor or acceptor impurity included in the semiconductor alloy melt deposited upon the solid semiconductor body. Moreover the P–N junction may be easily located since it is formed immediately beneath the solidified deposited semiconductor alloy melt at the former surface of the solid semiconductor body.

Although we have described particular methods embodying the invention, many modifications can be made, and we intend by the appended claims to cover all such modifications as fall within the true spirit and scope of the invention.

What we claim as new and desire to secure by Letters Patent of the United States is:

1. The method of making P–N junction units, which method comprises preparing a melt comprising a semiconductor selected from the group consisting of germanium and silicon and an electrically significant impurity element selected from the group consisting of donors and acceptors capable of inducing in said semiconductor conduction carriers of one predetermined polarity, said electrical impurity element being included in said melt to an extent providing a melting point of said melt that is less than 85% of the absolute temperature melting point of the semiconductor in said melt, and depositing said melt while in a liquid state and at a temperature less than 85% of the absolute temperature melting point of the semiconductor in said melt upon the surface of a solid semiconductor body having a predominance of conduction carriers therein whose polarity is opposite to that induced by the impurity element in said melt.

2. The method of making P–N junction units, which method comprises, preparing a melt consisting of a semiconductor selected from the group consisting of germanium and silicon and a first electrically significant impurity element selected from the group consisting of donors and acceptors inducing in said semiconductor conduction carrier of one predetermined polarity, the impurity being included in said melt to an extent providing a melting point of said melt that is less that 85% of the absolute temperature melting point of the semiconductor in said melt, depositing said melt while at a temperature above its melting point but less than 85% of the absolute temperature melting point of the semiconductor in said melt upon the surface of a solid monocrystalline body consisting of the same semiconductor as that in said melt and a second electrically significant impurity element selected from the group consisting of donors and acceptors inducing in said solid semiconductor body conduction carriers whose polarity is opposite to that induced by the impurity element in said melt, and allowing said deposited melt to cool and solidify on the surface of said body thereby to grow on the surface of said body an integral layer of semiconductor crystals of opposite conductivity type than said body.

3. The method of making P–N junction units, which method comprises preparing a melt consisting of a semiconductor selected from the group consisting of germanium and silicon and an acceptor impurity for said semiconductor, said impurity being included in said melt to an extent between 50% and 95% by weight of the total melt composition, depositing a portion of said melt while at a temperature less than 85% of the absolute melting temperature of said semiconductor upon the surface of a solid monocrystalline N-type semiconductor body, and allowing said deposited melt to cool and solidify upon said body thereby to grow on the surface of said body an integral layer of P-type semiconductor crystals.

4. The method of making P–N junction units, which method comprises, preparing a melt consisting of germanium and a donor impurity element for germanium in which the donor impurity content is between 65% and 90% by weight of the total melt, depositing a liquid droplet out of said melt while the melt is at a temperature less than 650° C. upon the surface of a solid monocrystalline P-type germanium body, and allowing said droplet to cool and solidify upon said body.

5. The method of making P–N junction units, which method comprises preparing a melt consisting of germanium and an acceptor impurity for germanium in which the impurity content is between 65% and 90% by weight of the total melt composition, depositing a portion of said melt while at a temperature less than 650° C. upon the surface of a solid monocrystalline N-type germanium body, and allowing said deposited melt to cool and solidify upon said body.

6. The method of making P–N junction units, which method comprises preparing a melt consisting of germanium, tin, and a minor percentage of arsenic, said tin and arsenic content being over 50% by weight of the total melt, depositing a portion of said melt while in a liquid state and at a temperature below 750° C. upon the surface of a solid monocrystalline P–type germanium body, and allowing said deposited melt to cool and solidify upon the surface of said body.

7. The method of making P–N junction units, which method comprises preparing a melt consisting of germanium and indium in which the indium content is over 40% and less than 95% by weight of the total melt, depositing a portion of said melt while in a liquid state and at a temperature less than 750° C. upon the surface of a solid monocrystalline N–type germanium body, and allowing said deposited melt to cool and solidify upon said body.

8. The method of making P–N junction units, which method comprises preparing a melt consisting of germanium, a donor impurity element for germanium and a neutral impurity element for germanium, said impurity elements being included in said melt to an extent between 50% and 95% by weight of the total melt, depositing a portion of said melt while in a liquid state and at a temperature below 750° C. upon a surface of a solid monocrystalline P–type germanium body having a resistivity above 2 ohm centimeters, and allowing said deposited melt portions to cool and solidify upon said body.

9. The method of making P–N junction units which method comprises preparing a melt comprising a semiconductor selected from the group consisting of germanium and silicon and an electrically significant impurity element selected from the group consisting of donors and acceptors capable of inducing in said semiconductor conduction carriers of one predetermined polarity and an electrically neutral impurity element, the impurity elements being included in said melt to an extent providing a melting point of said melt that is less than 85% of the absolute temperature melting point of the semiconductor in said melt, and depositing said melt while in a liquid state and at a temperature less than 85% of the absolute temperature melting point of the semiconductor in said melt upon the surface of a solid semiconductor body having a predominance of conduction carriers therein whose polarity is opposite to that induced by the impurity element in said melt.

10. The method of making P–N junction units, which method comprises preparing a melt consisting of a semiconductor selected from the group consisting of germanium and silicon and a first electrically significant impurity element selected from the group consisting of donors and acceptors inducing in said semiconductor conduction carriers of one predetermined polarity, the impurity being included in said melt to an extent providing a melting point of said melt that is less than 85% of the absolute temperature melting point of the semiconductor in said melt, depositing said melt while at a temperature above its melting point but less than 85% of the absolute temperature melting point of the semiconductor in said melt upon the surface of a solid monocrystalline body while said body is at a temperature of about 300° C., said body consisting of the same semiconductor as that in said melt and a second electrically significant impurity element selected from the group consisting of donors and acceptors inducing in said solid semiconductor body conduction carriers whose polarity is opposite to that induced by the impurity element in said melt, and allowing said deposited melt to cool and solidify on the surface of said body thereby to grow on the surface of said body an integral layer of semiconductor crystals of opposite conductivity type than said body.

References Cited in the file of this patent

UNITED STATES PATENTS 2,629,672 Sparks ---------------- Feb. 24, 1953